US006963140B2

(12) United States Patent
Sin et al.

(10) Patent No.: US 6,963,140 B2
(45) Date of Patent: Nov. 8, 2005

(54) TRANSISTOR HAVING MULTIPLE GATE PADS

(75) Inventors: Johnny Kin-On Sin, Hong Kong (CN); Ming Liu, Hong Kong (CN); Tommy Mau-Lau Lai, Hong Kong (CN)

(73) Assignee: Analog Power Intellectual Properties, Hong Kong (CN)

( * ) Notice: Subject to any disclaimer, the term of this patent is extended or adjusted under 35 U.S.C. 154(b) by 0 days.

(21) Appl. No.: 10/388,485

(22) Filed: Mar. 17, 2003

(65) Prior Publication Data

US 2005/0073012 A1 Apr. 7, 2005

(51) Int. Cl.[7] ......................... H01L 23/48; H01L 23/52; H01L 29/40; H01L 23/495; H01L 23/34

(52) U.S. Cl. ....................... 257/784; 257/676; 257/692; 257/723

(58) Field of Search ................................ 257/665–666, 257/676, 670, 690, 692, 723–724, 784

(56) References Cited

U.S. PATENT DOCUMENTS 4,982,247 A * 1/1991 Aoki et al. ................. 257/249
5,666,009 A 9/1997 Kumano et al.
5,767,567 A 6/1998 Hu et al.
6,184,585 B1 2/2001 Martinez et al.
6,201,263 B1 3/2001 Mizuuchi
6,404,050 B2 6/2002 Davis et al.
6,448,643 B2 9/2002 Cheah et al.
2001/0048154 A1 12/2001 Cheah et al.
2003/0013276 A1 * 1/2003 Asano et al. ............... 438/459
2003/0183924 A1 * 10/2003 Bhalla et al. ............... 257/723
2004/0004272 A1 * 1/2004 Luo et al. ................... 257/666

FOREIGN PATENT DOCUMENTS

CN 1195893 A 10/1998
EP 1184900 3/2002
GB 2268332 1/1994
JP 60-224256 11/1985
JP 11-340455 12/1999

* cited by examiner

*Primary Examiner*—Shouxiang Hu
(74) *Attorney, Agent, or Firm*—Buchanan Ingersoll PC

(57) ABSTRACT

Current practice of the common source configuration is to connect the sources of the two discrete MOSFETs (housed either in separated packages or in a single package) externally on the printed circuit board. Because the gate pads and source pads of the two dies are alternatively placed between gate and source, it does not allow the sources of the power MOSFETs to be connected internally, which requires an additional layer of circuit board to connect the sources and the gates externally. This invention provides a novel electronic device layout design and a novel packaging technique for common source configuration, placing two MOSFETs in a package with their sources connected to a single source post which is located between tow gate posts. In order to facilitate gate bonding and to prevent any shorting between gate and source, two gate pads are used and placed at the upper adjacent corners of each MOSFET.

4 Claims, 6 Drawing Sheets

TRANSISTOR HAVING MULTIPLE GATE PADS

FIELD OF THE INVENTION

This invention relates to electronic devices involving at least one transistor and a lead frame, particularly those for switching multiple power sources.

BACKGROUND OF THE INVENTION

Power MOSFETs (Metal-Oxide-Semiconductor Field Effect Transistors) are commonly used in numerous applications, including power supplies, portable devices and automotive electronics. MOSFET is a type of three-terminal transistor having a gate, a source and a drain terminal. One of the tasks of the power MOSFETs in these applications is to provide switching function and control the power delivery from the source to the load. One of the most popular applications of the power MOSFETs is for switching multiple power sources in notebook computers. In this case, a common source configuration of two power MOSFETs, as shown in FIG. 1 is required. The two power MOSFETs are basically connected back to back with the sources connected together.

In a typical notebook power supply system, the AC adaptor voltage is always higher than that of the battery voltage. When the power MOSFET is off, current can still flow to the battery through the body diode, as shown in FIG. 2. To prevent this current flow, a true on/off switch is required. One of the solutions is to connect the two power MOSFETs in a common source configuration between the AC adaptor and the main battery as shown in FIG. 3. This design has been used commonly in the current notebook supply systems.

Current practice of the common source configuration is to connect the sources of the two discrete MOSFETs (housed either in separated packages or in a single package) externally on the printed circuit board as shown in FIG. 4. In the case of conventional dual MOSFETs in a single package, one gate pad per die is used for the gate interconnect. The gate posts, source posts, and drain posts are all separated from each other. For ease of wire bonding to the gate posts, the gate pad is generally located at the upper left corner. Because the gate pads and source pads of the two dies are alternatively placed between gate and source, it does not allow the sources of the power MOSFETs to be connected internally. This is because the alternating gate and source will cause the gate to be shorted to the source during wire bonding if the two sources are connected together internally. Further, an additional layer of circuit board is required to connect the sources externally. All of these approaches may be relatively costly, as the manufacturing of the devices may be more complicate.

OBJECTS OF THE INVENTION

Therefore, it is an object of this invention to resolve at least one or more of the problems as set forth in the prior art. As a minimum, it is an object of this invention to provide the public with a useful choice.

SUMMARY OF THE INVENTION

Accordingly, this invention provides a device comprising:

at least one three-terminal transistor having at least two gate pads and at least one source pad, wherein the two gate pads are selectively operable, and the source pad is positioned between said two gate pads; and at least one lead frame having at least one source connection area for connecting source from the source pad, and at least one gate connection area for connecting the operable gate pads.

Preferably, wherein said transistor having at least two sides, and said two gate pads are positioned adjacent each of said sides. More preferably, the transistor is rectangular-shaped and having four corners, and each gate pad is positioned at or adjacent discrete one corner. The two gate pads are further preferred to be positioned at adjacent corners, or optionally at opposite corners.

Preferably, the device of this invention includes at least two said transistors. The two source pads of said two transistors may be connected to the at least one source connection area, and the lead frame may have at least two gate connection areas, and the source connection area is enlarged with respect to the gate connection areas.

It is another aspect of this invention to provide a three-terminal transistor having at least two gate pads and at least one source pad, wherein the two gate pads are selectively operable, and the source pad is positioned between said two gate pads.

It is yet another aspect of this invention to provide a lead frame having at least two gate connection areas and at least one source connection area for connecting at least two three-terminal transistors, each of said three-terminal transistors having at least two gate pads and at least one source pad, characterized in that the source connection area is enlarged with respect to the gate connection areas.

BRIEF DESCRIPTION OF THE DRAWINGS

Preferred embodiments of the present invention will now be explained by way of example and with reference to the accompany drawings in which.

DETAILED DESCRIPTION OF THE PREFERRED EMBODIMENT

Figure 1:
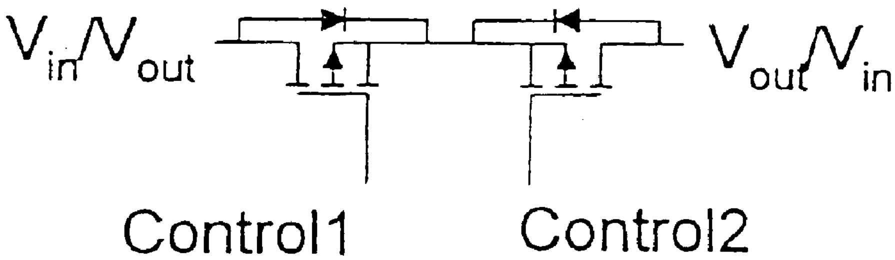
FIG. 1 shows a common source configuration.
Figure 2:
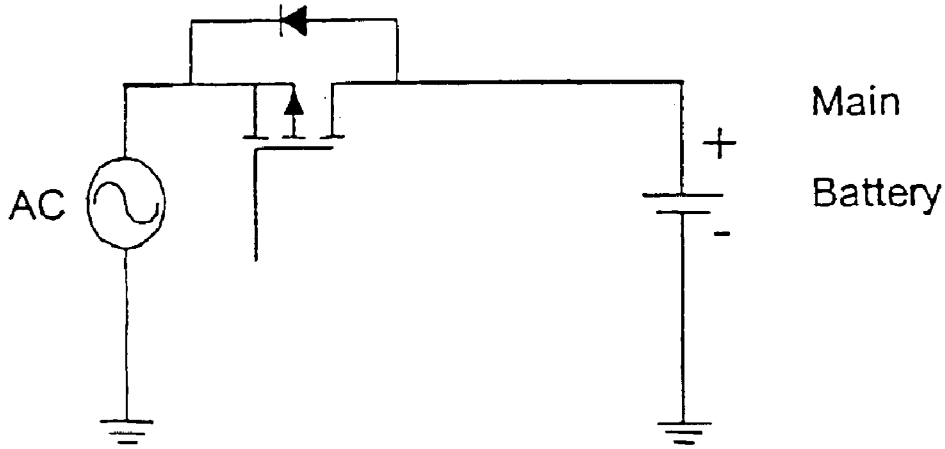
FIG. 2 shows a schematic diagram to illustrate the current flow from the AC adaptor to the main battery through the body diode even when the power MOSFET is in the off state.
Figure 3:
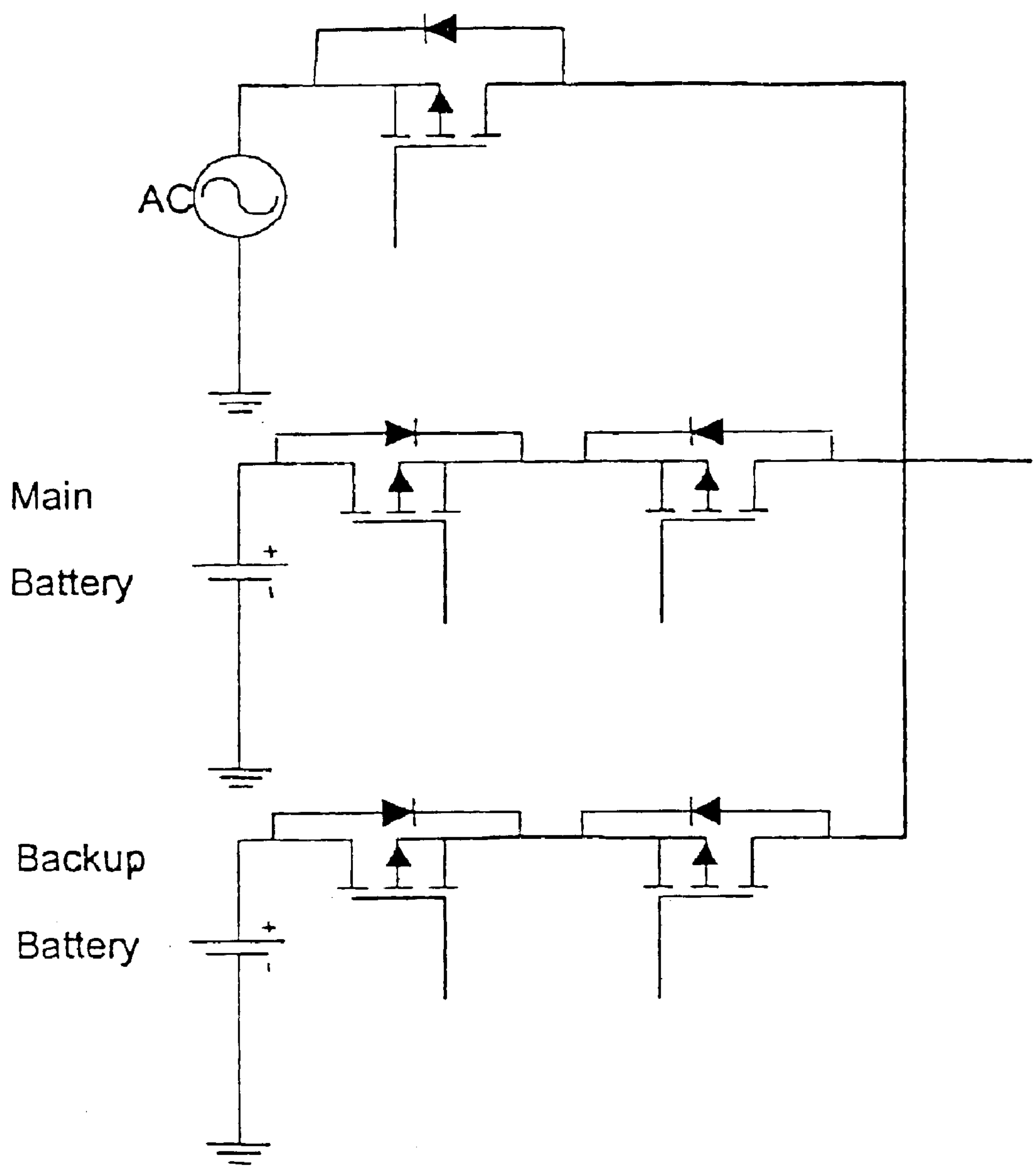
FIG. 3 shows an application of the common source configuration in a notebook computer system.
Figure 4:
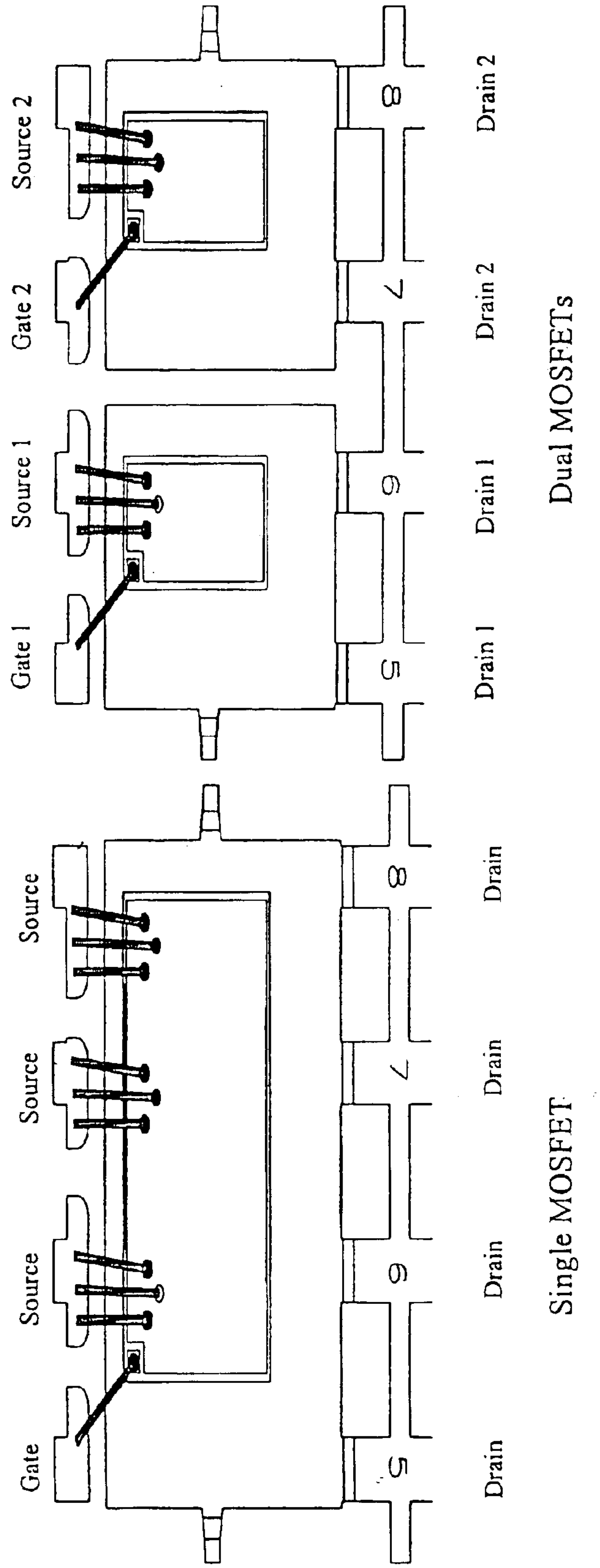
FIG. 4 shows conventional single and dual MOSFET(s) in a single package.

This invention is now described by way of example with reference to the figures in the following paragraphs. List 1 is a part list so that the reference numerals in the figures may be easily referred to.

Objects, features, and aspects of the present invention are disclosed in or are obvious from the following description. It is to be understood by one of ordinary skill in the art that the present discussion is a description of exemplary embodiments only, and is not intended as limiting the broader aspects of the present invention, which broader aspects are embodied in the exemplary constructions.

The following description assumes, for example, the above power MOSFETs as shown in FIG. 1 to FIG. 4 are contained in a single electronic package. A lead frame is generally defined as a piece of metal in a single electronic package, which carries at least one semiconductor component, such as a transistor, and provides leads for the semiconductor component to be connected with other system components.

As the manufacturing of MOSFETs and related technology is a relatively mature field, the basic manufacturing and the design of MOSFETs will not be further discussed here. Generally, a three-terminal transistor consists of one gate, one source, and one drain terminal.

Figure 5:
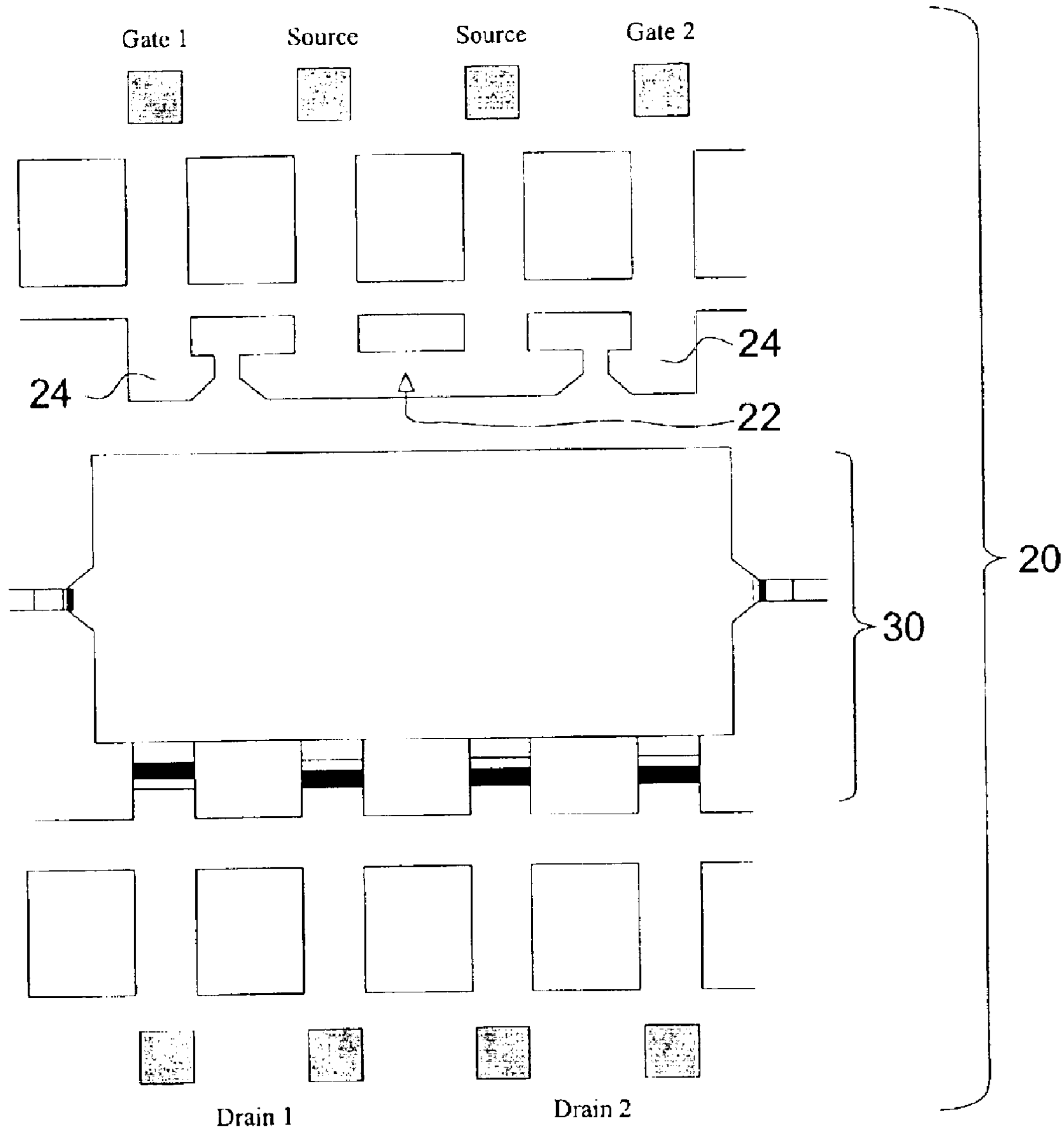
FIG. 5 the lead frame design of this invention for internally connected common source configuration.

This invention implements a common source configuration by connecting the two sources internally if possible to reduce cost, simplicity in circuit board layout, and more reliable in circuit interconnection. The invention provides an internally connected source for the implementation of the common source configuration that is made with two power MOSFETs in a single package. This approach is relatively simple in assembly and may not cause gate to source shorting during wire bonding. In a preferred embodiment, the device 10 of this invention is shown in FIG. 5 comprising a lead frame 20 and a transistor portion 30 that may contain at least one MOSFET. To achieve an internal source connection, as shown in FIG. 5, the center lead posts are merged together to form a source connection area 22 such that the pin configuration for the gate and source is changed as shown in FIG. 5. That is, the center lead post for connecting the source pad, which may also be called the source connection area 22, is larger than each of the two gate connection areas 24. The sources of the power MOSFET are connected to the source connection area 22. The source connection area 22 can have any desirable shape.

Figure 6:
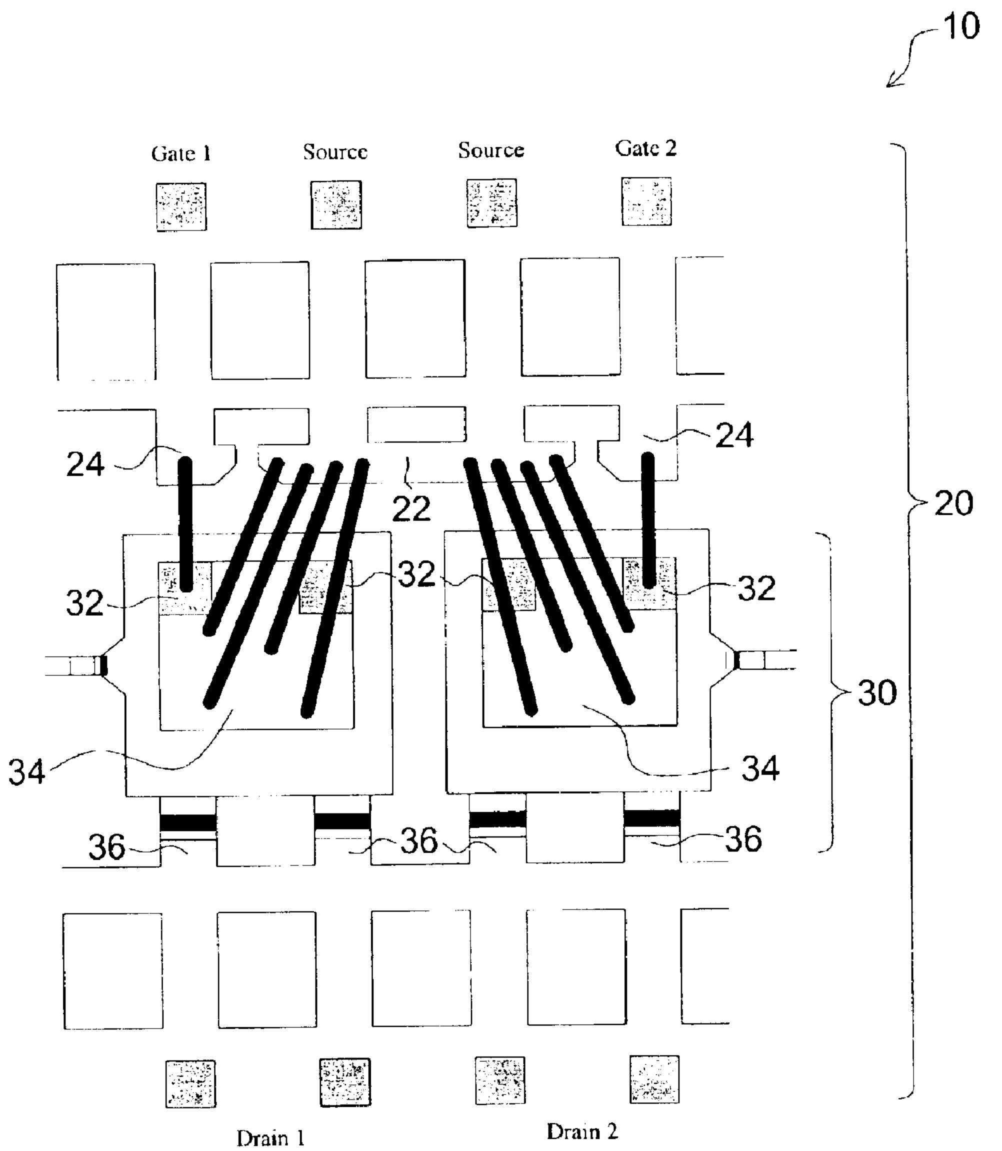
FIG. 6 shows an example of the power MOSFET layout design of this invention with gate pads at the upper adjacent corners of each power MOSFET.

To facilitate wire bonding to the gate pads and provide the functions as required, at least one more gate pad 32 is provided on each of the power MOSFETs, as shown in FIG. 6. The two gate pads 32 are provided at the upper adjacent corners as shown. However, the gate pads 32 may be provided at opposite corners if necessary. In fact, the two gate pads 32 may be positioned as desired, with the source pad 34 positioned between the two gate pads 32. Even though rare, there may be cases that require the MOSFET to be triangular- or even circular-shaped and as such positioning of the additional gate pads will need to suit the particular shape. Of course, the final design shall be practical and this will be known to a person skilled in the art. Putting the two gate pads 32 at adjacent corners of a rectangular-shaped MOSFET may be easier in manufacturing while requiring relatively little space to accommodate the connections required. Further, the MOSFET can have more than two gate pads 32 if desired, even though this may increase the overall manufacturing costs. The addition of extra gate pads 32 shall be obvious to person skilled in the art.

The design of the MOSFET and the source connection area 22 of this invention enable the bonding of the two independent gates of the power MOSFETs in the common source configuration without causing shorting between the gate and the source bonding wires. A device of this invention for use in a typical notebook power supply system, for example, is shown in FIG. 6. Two power MOSFETs are placed side by side in the transistor portion 30 of a package. They are wire-bonded to the lead frame 20 separately. The backside of each power MOSFET is connected to the separated drain posts 36. The drain posts 36 are located on one side of the lead frame, in this case, the lower side in FIG. 6. The gate and source posts are located on the opposite side so that they can all connect to the lead frame 20. Two gate pads 32 are placed at the upper adjacent corners of each power MOSFET in FIG. 6. One of the gate pads 32 on each power MOSFET is bonded to the corresponding gate post. The two center lead posts on the same side of the gate posts are merged together in FIG. 6 when compare to FIG. 5, which is used as the source connection area 22 of the two MOSFETs. Bonding of the gate connection area 24 to the gate pads 32 and the source connection area 22 to the source pads 34 will not cause shorting of bonding wires.

The preferred embodiment of this invention can be used in, for example, notebook power supply system. Of course, this invention can be used in other applications that require two back-to-back MOSFETs, for example automotive electronics, portable devices, power supplies.

Figure 7:
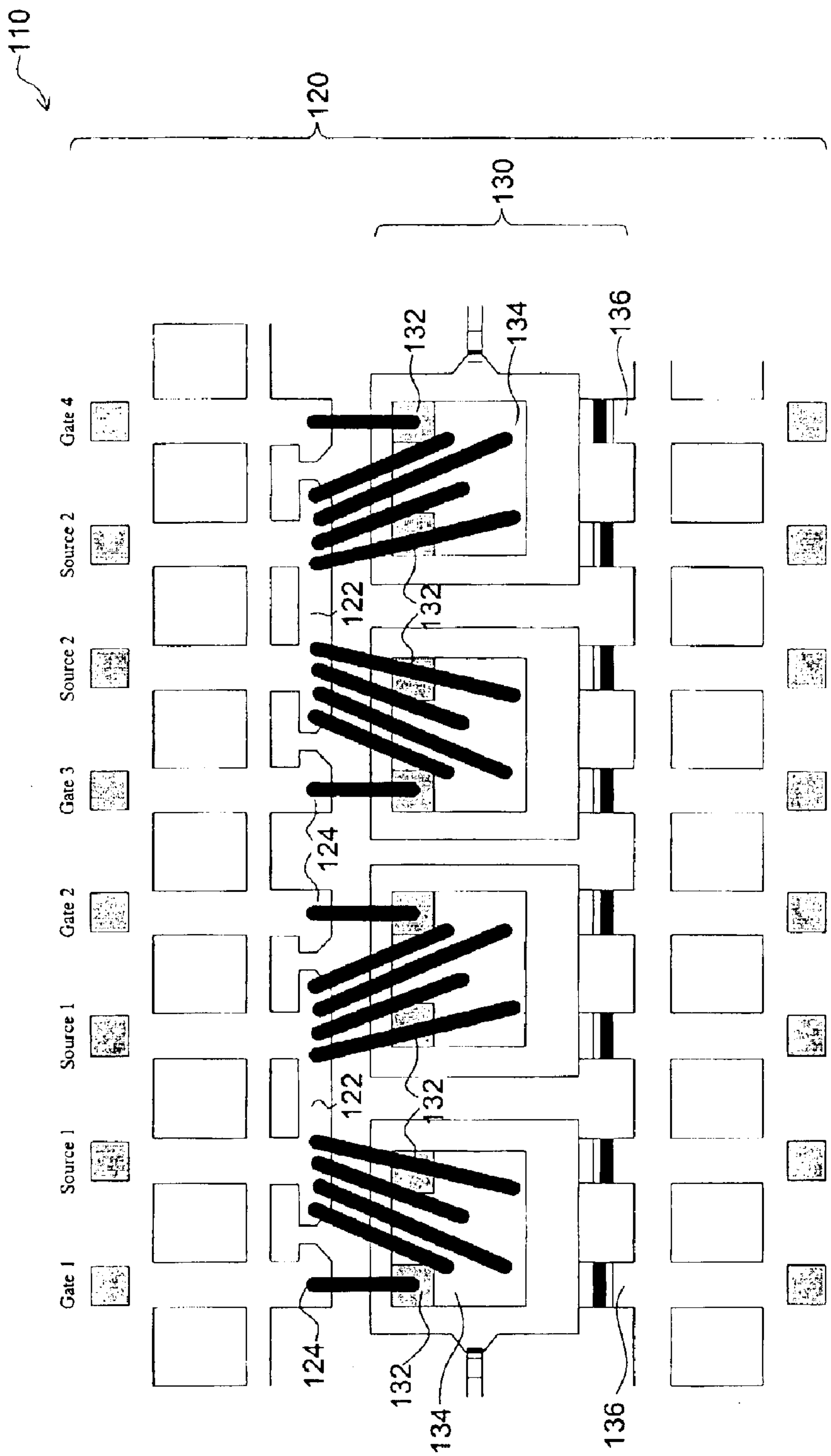
FIG. 7 shows an alternative example of the lead frame design of this invention having more than two power MOSFETs.

The device 10 of this invention as described above can be contained in a single electronic package, that is, an electronic package may contain the lead frame 20 and the two MOSFETs as described. However, it should be noted that a single electronic package may contain more than one of the device 10. In this case, the lead frame of a single electronic package, which now has a plurality of devices 10, may be considered to include a plurality of the lead frames 20 logically. The design of such a configuration would be obvious to a skilled person. As shown in FIG. 7, a device 110 has four MOSFETs positioned in the transistor portion 130, eight corresponding drain posts 136, and a lead frame 120. Each of the MOSFETs in FIG. 7, as described above, has two selectively operable gate pads 132 and a source pad 134. The lead frame 120 has two source connection areas 122 and four gate connection areas 124. Of course, if necessary, the device 110 can have more MOSFETs, source connection areas 122, and gate connection areas 124.

Further, the MOSFET can be utilized alone if necessary, for example, in applications where some of the gate pads 32 are required to be operable on one side of the MOSFET, while the others are required to be operable on the other side. In such applications, the device 10 may have only one MOSFET as described and one lead frame having one source connection area 22, and one gate connection area 24. In this case, both of the gate pads 32 may be operable.

While the preferred embodiment of the present invention has been described in detail by the examples, it is apparent that modifications and adaptations of the present invention will occur to those skilled in the art. Furthermore, the embodiments of the present invention shall not be interpreted to be restricted by the examples or figures only. It is to be expressly understood, however, that such modifications and adaptations are within the scope of the present invention, as set forth in the following claims. For instance, features illustrated or described as part of one embodiment can be used on another embodiment to yield a still further embodiment. Thus, it is intended that the present invention cover such modifications and variations as come within the scope of the claims and their equivalents.

What is claimed is:

1. A device comprising:

at least one pair of three-terminal transistors, each of said three-terminal transistors having first and second gate pads and a source pad; and at least one lead frame having at feast one source connection area connected to the source pads of said pair of transistors, and at least one gate connection area connected to the first gate pads of said transistors, wherein each said transistor is rectangular-shaped and has four discrete corners, and said first and second gate pads are separately and respectively positioned at or adjacent to two of said corners, and wherein the second gate pad of each of said transistors is un-bonded; and wherein, for each of said three-terminal transistors, a bonding wire connecting said source connection area and said source pad at least partially overlaps said second gate pad.

2. The device of claim 1, wherein the two source pads of said two transistors are connected to the at least one source connection area.

3. The device of claim 2, wherein the lead frame has at least two gate connection areas, and the source connection area is larger than the gate connection areas.

4. A device comprising:

at least one pair of three-terminal transistors, each of said three-terminal transistors having first and second gate pads and a source pad; and at least one lead frame having at least one source connection area connected to the source pads of said pair of transistors, and at least one gate connection area connected to the first gate pads of said transistors, wherein each said transistor is rectangular-shaped and has four discrete corners, and said first and second gate pads are separately and respectively positioned at or adjacent to two of said corners, and wherein the second gate pad of each of said three-terminal transistors has no connection exterior to said three-terminal transistor; and wherein, for each of said three-terminal transistors, a bonding wire connecting said source connection area and said source pad at least partially overlaps said second gate pad.

* * * * *

UNITED STATES PATENT AND TRADEMARK OFFICE

CERTIFICATE OF CORRECTION

PATENT NO. : 6,963,140 B2
APPLICATION NO. : 10/388485
DATED : November 8, 2005
INVENTOR(S) : Johnny Kin On Sin et al.

It is certified that error appears in the above-identified patent and that said Letters Patent is hereby corrected as shown below:

On Title Page, Col. 1 Item (73) Assignee: change "Analog Power Intellectual Properties" to "Analog Power Intellectual Properties Limited".

Signed and Sealed this

Twenty-first Day of November, 2006

JON W. DUDAS
*Director of the United States Patent and Trademark Office*